United States Patent
Adiga et al.

(10) Patent No.: US 11,575,077 B2
(45) Date of Patent: Feb. 7, 2023

(54) MICROFABRICATED AIR BRIDGES FOR QUANTUM CIRCUITS

(71) Applicant: INTERNATIONAL BUSINESS MACHINES CORPORATION, Armonk, NY (US)

(72) Inventors: Vivekananda P. Adiga, Ossining, NY (US); Hongwen Yan, Somers, NY (US); John M. Papalia, New York, NY (US); David L. Rath, Stormville, NY (US); Jyotica Patel, Port Chester, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 202 days.

(21) Appl. No.: 16/741,595

(22) Filed: Jan. 13, 2020

(65) Prior Publication Data
US 2021/0217947 A1    Jul. 15, 2021

(51) Int. Cl.
*H01L 39/06* (2006.01)
*G06N 10/00* (2022.01)
(Continued)

(52) U.S. Cl.
CPC ............ *H01L 39/06* (2013.01); *G06N 10/00* (2019.01); *H01L 39/12* (2013.01);
(Continued)

(58) Field of Classification Search
CPC ..... H01L 39/06; H01L 39/12; H01L 39/2406; H01L 27/18; H01L 39/14; H01L 39/24; G06N 10/00
See application file for complete search history.

(56) References Cited

U.S. PATENT DOCUMENTS

| 4,670,297 A | 6/1987 | Lee et al. |
| 5,117,207 A | 5/1992 | Powell et al. |

(Continued)

FOREIGN PATENT DOCUMENTS

| WO | 2018004635 A1 | 1/2018 |
| WO | 2019045762 A1 | 3/2019 |

OTHER PUBLICATIONS

Lankward et al.,"DevelopmentofNbTiIN-AlDirectAntennaCoupledKineticInductance Detectors",JournalofLow emperaturePhysics,KluwerAcademicPublishers—ConsultantsBureau,NE,vol. 167,No. 3-4,Jan. 20, 2012,pp. 367-372 (Year: 2012).*

(Continued)

*Primary Examiner* — Ermias T Woldegeorgis
(74) *Attorney, Agent, or Firm* — Amin, Turocy & Watson, LLP

(57) ABSTRACT

A method for fabricating a bridge structure in a quantum mechanical device includes providing a substructure including a substrate having deposited thereon a layer of a first superconducting material divided into a first portion, a second portion and a third portion that are electrically insulated from each other; depositing a sacrificial layer on the substructure; electrically connecting the first portion and the second portion with a strip of a second superconducting material, the second superconducting material being different from the first superconducting material; and removing a portion of the sacrificial layer so as to form a bridge structure over the third portion between the first portion and the second portion, the bridge structure electrically connecting the first portion to the second portion while not electrically connecting the third portion to the first portion and not electrically connecting the third portion to the second portion.

21 Claims, 10 Drawing Sheets

(51) Int. Cl.
    *H01L 39/12*     (2006.01)
    *H01L 39/24*     (2006.01)
    *H01L 39/14*     (2006.01)
    *H01L 27/18*     (2006.01)

(52) U.S. Cl.
    CPC .......... *H01L 39/2406* (2013.01); *H01L 27/18* (2013.01); *H01L 39/14* (2013.01); *H01L 39/24* (2013.01)

(56) References Cited

U.S. PATENT DOCUMENTS

| | | | |
|---|---|---|---|
| 5,194,833 | A | 3/1993 | Dougherty et al. |
| 9,177,814 | B2 | 11/2015 | Chang et al. |
| 9,455,392 | B2 | 9/2016 | Abraham et al. |
| 9,564,573 | B1 | 2/2017 | Chang et al. |
| 9,614,270 | B2 | 4/2017 | Chang et al. |
| 2016/0322693 | A1 | 11/2016 | Chang et al. |
| 2019/0042964 | A1 | 2/2019 | Elsherbini et al. |
| 2019/0067787 | A1* | 2/2019 | Chang ............... H05K 3/00 |
| 2019/0089033 | A1 | 3/2019 | Adiga et al. |

OTHER PUBLICATIONS

Abuwasib et al. "Fabrication of large dimension aluminum airbridges for superconducting quantum circuits." Journal of Vacuum Science & Technology B, Nanotechnology and Microelectronics: Materials, Processing, Measurement, and Phenomena 31, No. 3 (2013): 031601.

Chen et al., "Fabrication and characterization of aluminum air bridges for superconducting microwave circuits." Applied Physics Letters 104, No. 5 (2014): 052602.

Schicke et al., "Integrated niobium thin film air bridges as variable capacitors for superconducting GHz electronic circuits." IEEE transactions on applied superconductivity 13, No. 2 (2003): 135-137.

Attar, Sara S., "Low Temperature Superconducting RF MEMS Devices", PhD Thesis, University of Waterloo, Ontario, Canada, 2014.

Alcheikh et al., "Temperature dependence of the electromechanical characteristics of superconducting RF-MEMS switches." Microsystem Technologies 21, No. 1 (2015): 301-307.

Denis et al., "Fabrication of superconducting vacuum-gap crossovers for high performance microwave applications." IEEE Transactions on Applied Superconductivity 27, No. 4 (2016): 1-4.

Schicke et al., "Variable capacitors in meander-suspended superconducting microbridge technology for high frequency applications." In Sixteenth International Symposium on Space Terahertz Technology, pp. 181-184. 2005.

Dunsworth et al. "A method for building low loss multi-layer wiring for superconducting microwave devices." Applied Physics Letters 112, No. 6 (2018): 063502.

Jin et al., "Fabrication of Al air-bridge on coplanar waveguide." Chinese Physics B 27, No. 10 (2018): 100310.

Lankwarden et al., "Development of NbTiN-Al Direct Antenna Coupled Kinetic Inductance Detectors", Journal of Low Temperature Physics, Kluwer Academic Publishers—Consultants Bureau, NE, vol. 167, No. 3-4, Jan. 20, 2012, pp. 367-372.

PCT/EP2020/085931 International Search Report completed Mar. 15, 2021.

PCT/EP2020/085931 Written Opinion completed Mar. 15, 2021.

* cited by examiner

MICROFABRICATED AIR BRIDGES FOR QUANTUM CIRCUITS

BACKGROUND

The currently claimed embodiments of the present invention relate to quantum circuits, and more specifically, to methods of fabricating a bridge structure in a quantum mechanical device and a quantum mechanical device having the bridge structure.

Quantum computation is based on the reliable control of quantum bits (referred to herein throughout as qubits), The fundamental operations required to realize quantum algorithms are a set of single-qubit operations and two-qubit operations which establish correlations between two separate quantum bits. The realization of high fidelity two-qubit operations may be desirable both for reaching the error threshold for quantum computation and for reaching reliable quantum simulations.

The superconducting quantum processor (having one or more superconducting qubits) includes superconducting metals (e.g., Al, Nb, etc.) on an insulating substrate (e.g., Si or high resistivity Si, $Al_2O_3$, etc.). The superconducting quantum processor is typically a planar two-dimensional lattice structure or circuit of individual qubits linked by a coupler in various lattice symmetry (for example, square, hexagonal, etc.), and a readout structure located on a flip-chip. The couplers can be made of a capacitor, a resonator, a coil or any microwave component that provides a coupling between qubits.

Superconducting microwave circuits based on coplanar waveguides (CPW) are susceptible to parasitic slot-line modes. These modes can couple to elements of the circuit such as qubits and thus can lead to signal loss and decoherence. In order to eliminate these spurious modes, cross-over connections are usually made between ground planes that are interrupted by the coplanar waveguides (CPW). Free standing crossovers known as airbridges are conventionally used for that purpose. However, problems remain in the fabrication of these airbridges leading to less than desirable quantum mechanical devices or circuits.

SUMMARY

An aspect of the present invention is to provide a method for fabricating a bridge structure in a quantum mechanical device. The method includes providing a substructure comprising a substrate having deposited thereon a layer of a first superconducting material divided into a first portion, a second portion and a third portion that are electrically insulated from each other. The method further includes depositing a sacrificial layer on the substructure, and electrically connecting the first portion and the second portion of the first superconducting material with a strip of a second superconducting material, the second superconducting material being different from the first superconducting material. The method also includes removing a portion of the sacrificial layer deposited on the substructure so as to form a bridge structure with the strip of the second superconducting material over the third portion between the first portion and the second portion, the bridge structure electrically connecting the first portion to the second portion while not electrically connecting the third portion to the first portion and not electrically connecting the third portion to the second portion.

In an embodiment, providing the substructure includes providing the substrate having a surface and depositing the layer of the first superconducting material on the surface of the substrate. In an embodiment, providing the substructure further includes etching the layer of the first superconducting material to form a first trench and a second trench so as to define the first portion, the second portion and the third portion of the layer of the first superconducting material such that the first portion, the second portion and the third portion of the layer of the first superconducting material are spaced apart from each other by the etched first trench and the etched second trench.

In an embodiment, the substrate includes silicon or sapphire. In an embodiment, the first superconducting material includes niobium or aluminum. In an embodiment, the sacrificial layer includes titanium (Ti), titanium nitride (TiN), or tantalum (Ta), or any combination thereof.

In an embodiment, depositing the sacrificial layer on the substructure includes sputtering superconducting sacrificial material on the substructure. In an embodiment, electrically connecting the first portion and the second portion of the first superconducting material with the strip of the second superconducting material includes sputtering compressively stressed superconducting material to form the strip of the second superconducting material. In an embodiment, electrically connecting the first portion and the second portion of the first superconducting material with the strip of the second superconducting material includes attaching a first base pad of the strip to the first portion and attaching a second base pad of the strip to the second portion. In an embodiment, electrically connecting the first portion and the second portion of the first superconducting material with the strip of the second superconducting material includes electrically connecting the first portion and the second portion of the first superconducting material with a strip of porous second superconducting material.

In an embodiment, removing the portion of the sacrificial layer deposited on the substrate includes etching a portion of the sacrificial layer under the strip so as to form a gap between the strip and the third portion of the first superconducting material to define the bridge structure over the third portion of the first superconducting material. In an embodiment, etching the portion of the sacrificial layer under the strip includes etching the portion of the sacrificial layer using an acid etch. In an embodiment, etching the portion of the sacrificial layer under the strip includes etching the sacrificial layer under the strip that is deposited on the third portion and etching the sacrificial layer deposited within a first trench and a second trench separating the first, second and third portion and not etching the sacrificial layer at both ends of the strip.

In an embodiment, providing the substructure includes providing the substrate having a surface; depositing a layer of sacrificial material on the surface of the substrate; selectively etching the layer of sacrificial material to form first and second spaced apart portions of the sacrificial material; selectively etching the substrate except at the first and second portions of the sacrificial material; depositing a layer of the first superconducting material on the etched substrate and the first and second portions of the sacrificial material; and removing the deposited layer of the first superconducting material and the first and second portions of sacrificial material to obtain a layer of the first superconducting material divided into the first portion, the second portion and the third portion that are electrically insulated from each other by substrate material.

In an embodiment, depositing the sacrificial layer on top of the substructure includes sputtering superconducting sacrificial material on the layer of the first superconducting material. In an embodiment, removing the portion of the sacrificial layer deposited on the substrate includes etching a portion of the sacrificial layer under the strip and etching the substrate material separating the first, second and third portion of the superconducting material so as to form a gap between the strip and the third portion of the first superconducting material to define the bridge structure over the third portion of the first superconducting material.

Another aspect of the present invention is to provide a quantum mechanical device, including a substrate; and a layer of a first superconducting material deposited on the substrate, the layer being divided into a first portion, a second portion and a third portion that are electrically insulated from each other. The quantum mechanical device further includes a bridge structure connected to the first portion and the second portion over the third portion that is located between the first portion and the second portion, the bridge structure having a strip of a second superconducting material configured to electrically connect the first portion and the second portion of the first superconducting material. The second superconducting material of the strip is different from the first superconducting material.

In an embodiment, the second superconducting material of the strip is porous at least in a portion that traverses the third portion of the layer of the first superconducting material. In an embodiment, the first portion and the second portion of the first superconducting material are connected to a same ground potential. In an embodiment, the third portion of the first superconducting material is a signal line configured to carry an electromagnetic signal to and from a qubit. In an embodiment, the bridge structure is configured to substantially eliminate spurious modes of planar microwave circuits. In an embodiment, the first portion and the second portion of the layer of the first superconducting material are first and second signal lines configured to carry a first electromagnetic signal to or from a first qubit and the third portion is a third signal line configured to carry a second electromagnetic signal to or from a second qubit.

In an embodiment, the quantum mechanical device further includes a plurality of bridge structures spaced apart regularly to electrically connect the first portion and the second portion of the layer of the first superconducting material at a plurality of position of the layer of the first superconducting material. In an embodiment, the plurality of bridge structures is configured to connect the first portion and the second portion of the layer of the first superconducting material to a same ground potential.

The bridge structure can be used, for example, to eliminate spurious modes of planar microwave circuits by connecting ground planes or to cross-over a signal line. This allows to access the fenced in qubits, thus allowing to break the plane for superconducting two-dimensional (2D) quantum circuit. The bridge structure can include a superconducting material and is fabricated with a distinct process compared to first layer fabrication process which fabricates qubits and rest of the circuit. This provides the flexibility of using different materials. In addition, the present methods and quantum mechanical device achieve a better yield due to prestress and buckled nature of the bridge structure. Furthermore, there is no need to connect signal lines with different fabrication runs, thus reducing or lowering signal loss.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1A:
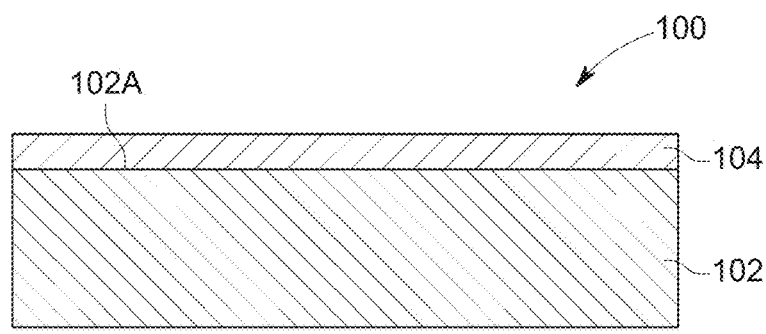
FIG. 1A is a schematic lateral view of a substructure including a substrate on which is deposited a first superconducting material, according to an embodiment of the present invention.
Figure 1B:
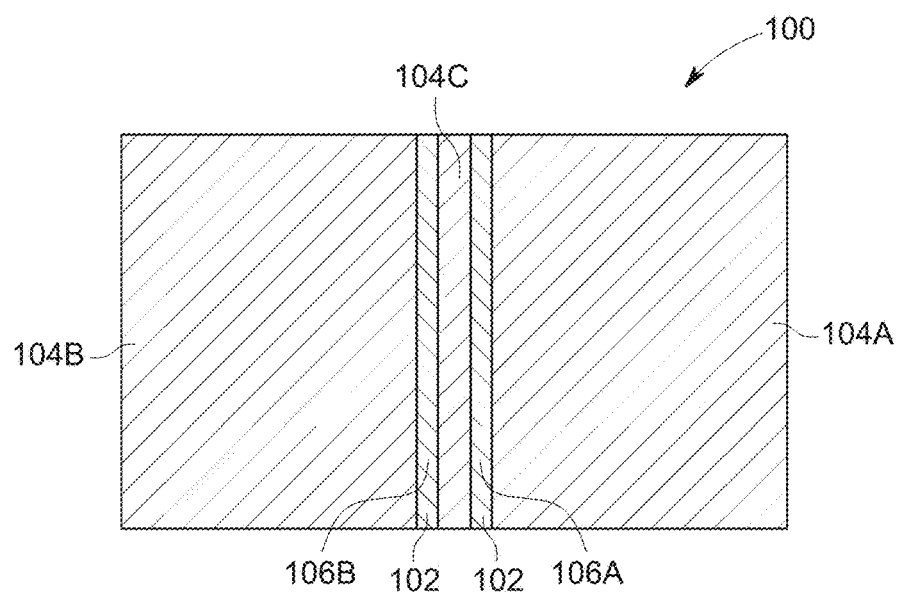
FIG. 1B is a schematic top view of the substructure including the substrate with the first superconducting material deposited thereon, according to an embodiment of the present invention.

In an embodiment of the present invention, there is provided a method for fabricating a bridge structure in a quantum mechanical device. The method includes providing a substructure 100 having the substrate 102 having deposited thereon a layer of the first superconducting material 104. FIG. 1A is a schematic lateral view of the substructure 100 including the substrate 102 on which is deposited the first superconducting material 104, according to an embodiment of the present invention. FIG. 1B is a schematic top view of the substructure 100 including the substrate 102 with the first superconducting material 104 deposited thereon, according to an embodiment of the present invention. In an embodiment, the substrate 102 can be silicon or sapphire, for example. In an embodiment, the first superconducting material 104 may include niobium (Nb), aluminum (Al), or the like.

The first superconducting material layer 104 is divided into a first portion 104A, a second portion 104B and a third portion 104C that are electrically insulated from each other, as shown in FIG. 1B. The first portion 104A, the second portion 104B and the third portion 104C are electrically insulated from each other by the presence of a first trench 106A between the first portion 104A and the third portion 104C and a second trench 106B between the second portion 104B and the third portion 104C, through which the substrate 102 can be seen, as shown in FIG. 1B.

In an embodiment, the substrate 102 has a surface 102A on which is deposited the layer of the first superconducting material 104, as shown in FIG. 1A. In an embodiment, providing the substructure 100 includes etching the layer of the first superconducting material 104 to form the first trench 106A and the second trench 106B so as to define the first portion 104A, the second portion 104B and the third portion 104C of the layer of the first superconducting material 104 such that the first portion 104A, the second portion 104B and the third portion 104C of the layer of the first superconducting material 104 are spaced apart from each other by the etched first trench 106A and the etched second trench 106B. In an embodiment, the third portion 104C is located between the first portion 104A and the second portion 104B, as shown in FIG. 1B.

In an embodiment, the first portion 104A and the second portion 104B of the first superconducting material 104 are connected to a same ground potential. In an embodiment, the third portion 104C of the first superconducting material 104 is a signal line configured to carry an electromagnetic signal to and from a qubit (not shown).

Figure 2:
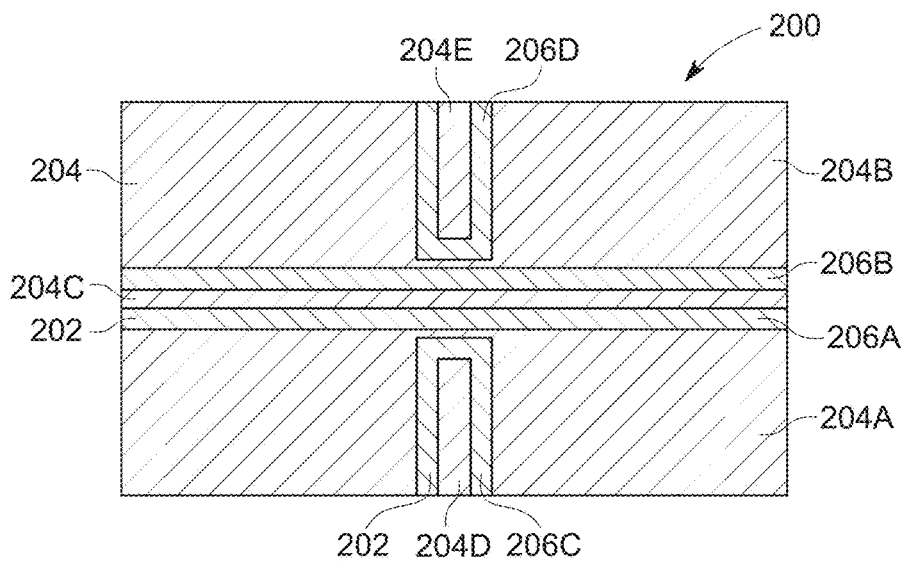
FIG. 2 is a schematic top view of a substrate with a superconducting material deposited thereon, according to another embodiment of the present invention.

FIG. 2 is a schematic top view of a substrate with a superconducting material deposited thereon, according to another embodiment of the present invention. In an embodiment, the method may also include providing a substructure 200 having a substrate 202 having deposited thereon a layer of a first superconducting material 204, as shown in FIG. 2. In this embodiment, the first superconducting material layer 204 has a first portion 204A, a second portion 204B and a third portion 204C. In an embodiment, the first portion 204A and the second portion 204B of the first superconducting material layer 204 are connected to a same ground potential. In an embodiment, the third portion 204C of the first superconducting material 204 is a signal line configured to carry an electromagnetic signal to or from a qubit (not shown). The first portion 204A, the second portion 204B and the third portion 204C are electrically insulated from each other by the presence of a first trench 206A between the first portion 204A and the third portion 204C and a second trench 206B between the second portion 204B and the third portion 204C, through which the substrate 202 can be seen, as shown in FIG. 2.

Similar to the previous embodiment, providing the substructure 200 includes etching the layer of the first superconducting material layer 204 to form the first trench 206A and the second trench 206B so as to define the first portion 204A, the second portion 204B and the third portion 204C of the layer of the first superconducting material 204 such that the first portion 204A, the second portion 204B and the third portion 204C of the layer of the first superconducting material 204 are spaced apart from each other by the etched first trench 206A and the etched second trench 206B.

In addition to the first portion 204A, the second portion 204B and the third portion 204C, the first superconducting material layer 204 further includes a fourth portion 204D and a fifth portion 204E. The fourth portion 204D is electrically insulated from the first portion 204A, the second portion 204B and the third portion 204C. Similarly, the fifth portion 204E is also electrically insulated from the first portion 204A, the second portion 204B, the third portion 204C and the fourth portion 204D. The fourth portion 204D is electrically insulated from the first portion 204A by the presence of a trench 206C etched in the layer of first superconducting material 204. The trench 206C forms a U-shape to insulate the fourth portion 204D from the first portion 204A. The fifth portion 204E is electrically insulated from the second portion 204B by the presence of a trench 206D etched in the layer of first superconducting material 204. The trench 206D forms a U-shape to insulate the fifth portion 204E from the second portion 204B.

In an embodiment, the first portion 204A and the second portion 204B are both electrically connected to a ground potential. In an embodiment, the third portion 204C is a first signal line configured to carry a first electromagnetic signal to or from a first qubit. In an embodiment, the fourth portion 204D and the fifth portion 204E when connected to each other using a bridge structure form a second signal line configured to carry a second electromagnetic signal to or from a second qubit.

Figure 3:
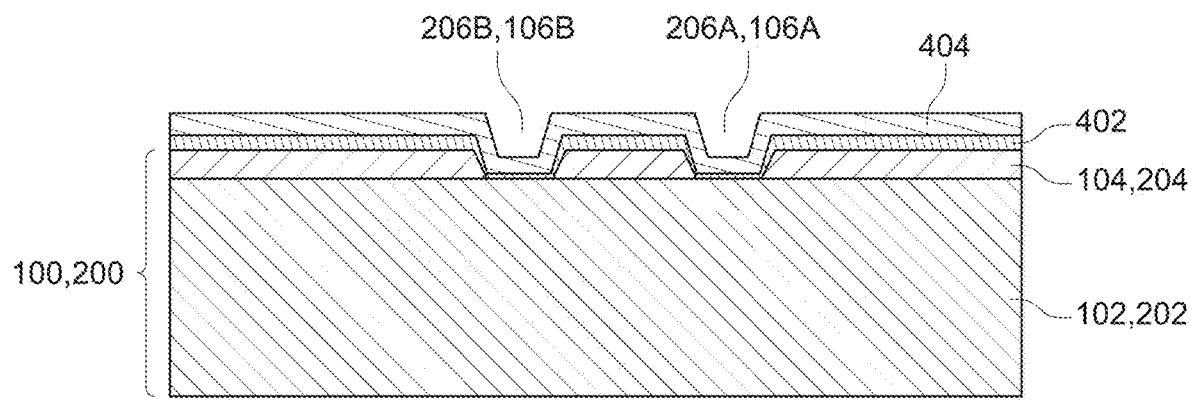
FIG. 3 is a schematic lateral view of the substrate with the first superconducting material and a sacrificial resist layer deposited thereon, according to an embodiment of the present invention.

FIG. 3 is a schematic lateral view of the substrate 102, 202 with the first superconducting material 104, 204 and sacrificial resist layer 402 deposited thereon, according to an embodiment of the present invention. In an embodiment, the method further includes depositing the sacrificial layer 402 on the substructure 100, 200. In an embodiment, the sacrificial layer includes titanium (Ti), titanium nitride (TiN), or tantalum (Ta), or any combination thereof. In an embodiment, depositing the sacrificial layer 402 comprises sputtering superconducting sacrificial material on the substructure 100, 200. In an embodiment, the sacrificial layer 402 is deposited on the first superconducting material layer 104, 204 and on the substrate 102, 202 within the trenches 106A, 106B, 206A, 206B, 206C, 206D.

Figure 4A:
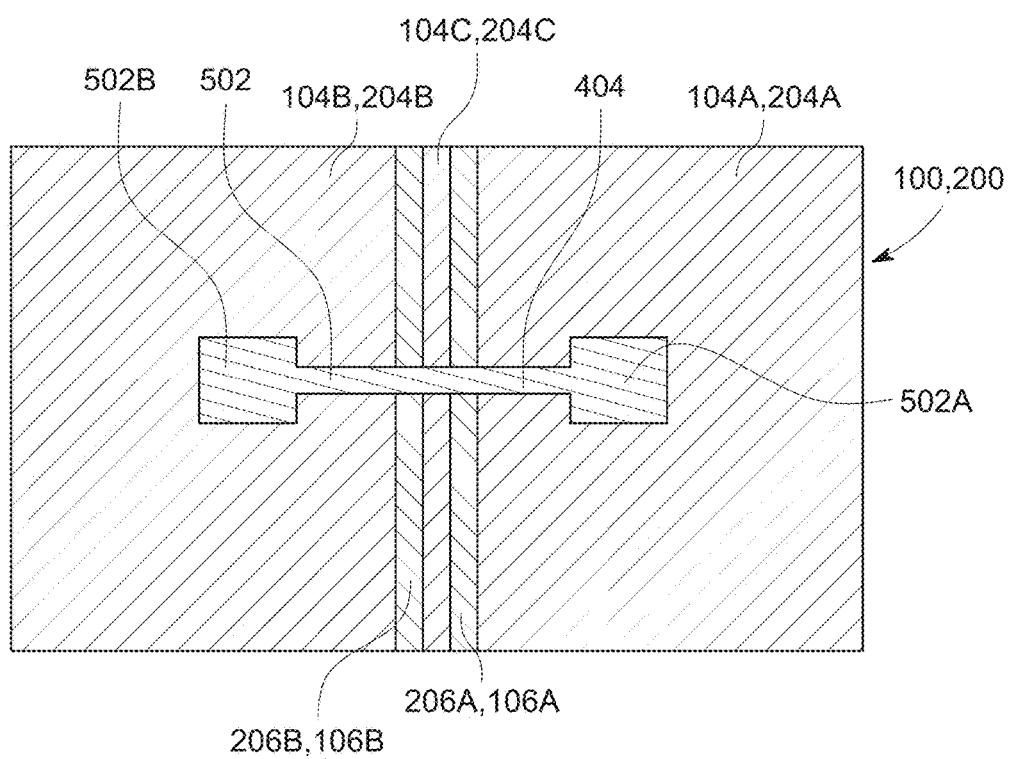
FIG. 4A is a schematic top view of a substructure having formed thereon a strip of a second superconducting material over a third portion of the first superconducting material, according to an embodiment of the present invention.

In an embodiment, the method includes electrically connecting the first portion 104A, 204A and the second portion 104B, 204B of the first superconducting material 104, 204 with a strip 502 of a second superconducting material 404, the second superconducting material 404 being different from the first superconducting material 104, 204. FIG. 4A is a schematic top view of the substructure 100, 200 having formed thereon the strip 502 of the second superconducting material 404 over third portion 104C, 204C, according to an embodiment of the present invention.

In an embodiment, the second superconducting material 404 is deposited on the sacrificial layer 402, as shown in FIG. 3. The second superconducting material 404 is different from the first superconducting material 104, 204. In an embodiment, depositing the second superconducting material 404 on the substructure 100, 200 includes sputtering compressively stressed superconducting material 404 to form the strip 502 of the second superconducting material 404, as shown in FIG. 4A. In an embodiment, the strip 502 traverses or crosses the third portion 104C, 204C, as shown in FIG. 4A. Although, the strip 502 is shown crossing the third portion 104C, 204C at a substantially right angle, as it can be appreciated the strip 502 can be made to cross the third portion 104C, 204C at any other angle. In an embodiment, electrically connecting the first portion 104A, 204A and the second portion 104B. 204B of the first superconducting material 104, 204 with the strip 502 of the second superconducting material 404 includes attaching a first base pad 502A at an end of the strip 502 to the first portion 104A, 204A and attaching a second base pad 502B at an end of the strip 502 to the second portion 104B, 204B.

Figure 4B:
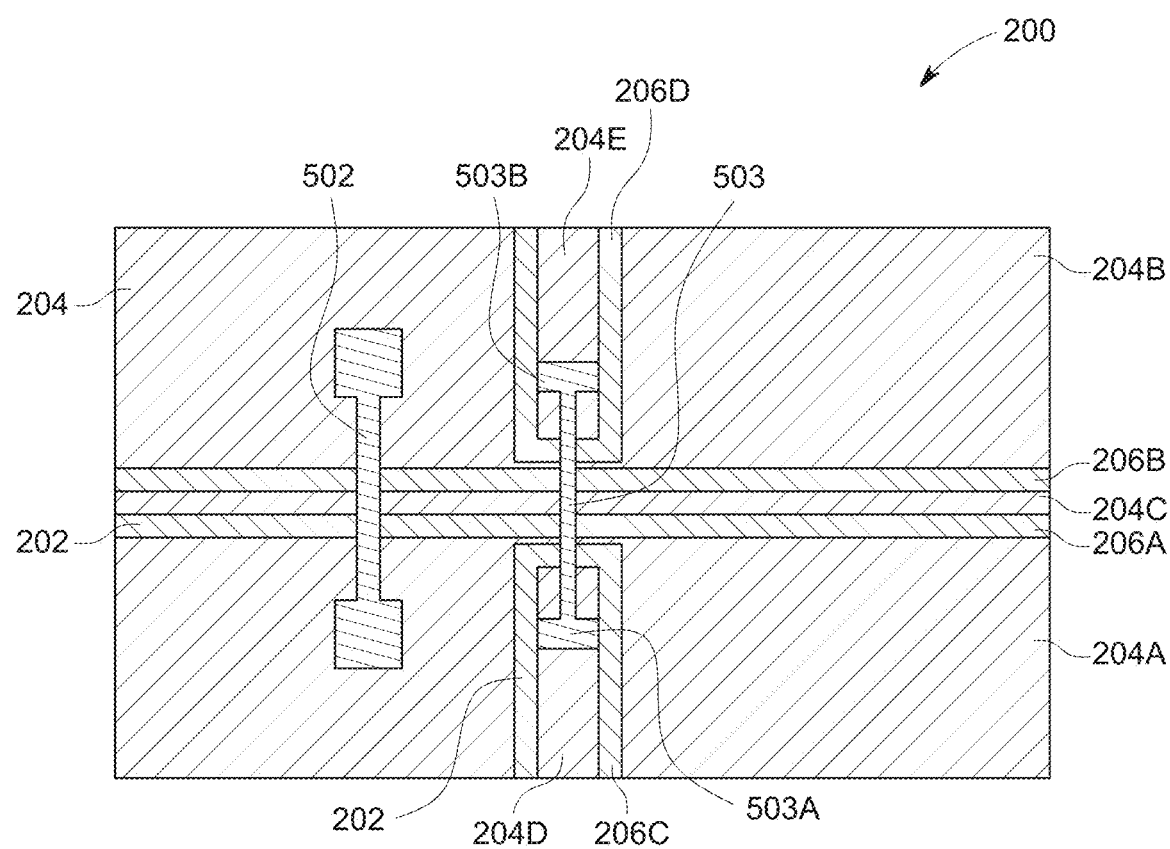
FIG. 4B is a schematic top view of the substructure having formed thereon the strip of the second superconducting material over the third portion and electrically connecting a fourth portion and a fifth portion of the first superconducting material, according to an embodiment of the present invention.

FIG. 4B is a schematic top view of the substructure 100, 200 having formed thereon the strip 502 of the second superconducting material 404 over third portion 204C and electrically connecting fourth portion 204D and fifth portion 204E, according to an embodiment of the present invention. In an embodiment, the method can also include electrically connecting the fourth portion 204D and the fifth portion 204E of the first superconducting material 204 with a strip 503 of a second superconducting material 404, the second superconducting material 404 being different from the first superconducting material 204. In an embodiment, electrically connecting the fourth portion 204D and the fifth portion 204E of the first superconducting material 204 with the strip 503 of the second superconducting material 404 includes attaching a first base pad 503A at an end of the strip 503 to the fourth portion 204D and attaching a second base pad 503B at an end of the strip 503 to the fifth portion 204E so as to form a line for transmitting an electromagnetic signal to or from a qubit, for example. In this case, the strip 503 traverses the first portion 204A, the second portion 204B and the third portion 204C, as shown in FIG. 4B. In an embodiment, the strip 503 of the second superconducting material 404 includes a strip of porous second superconducting material 404.

Figure 5:
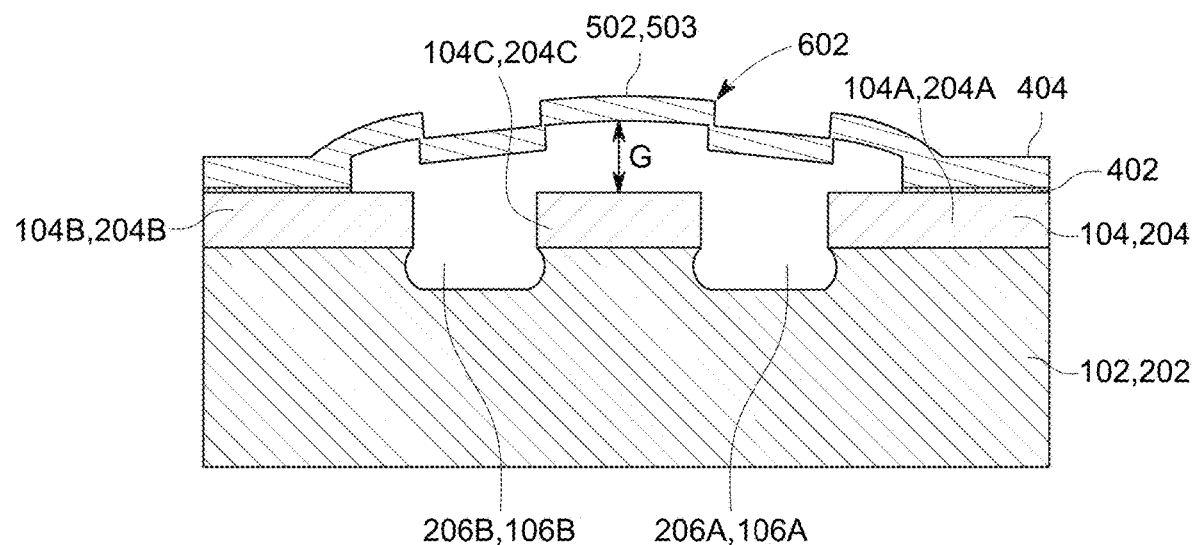
FIG. 5 is a schematic lateral view of the substructure having formed thereon a bridge structure with the strip of the second superconducting material, according to an embodiment of the present invention.

In an embodiment, the method includes removing a portion of the sacrificial layer 402 deposited on the substructure 100, 200 so as to form a bridge structure 602 with the strip 502, 503 of the second superconducting material 404 over the third portion 104C, 204C between the first portion 104A, 204A and the second portion 104B, 204B. FIG. 5 is a schematic lateral view of the substructure 100, 200 having formed thereon the bridge structure 602 with the strip 502, 503, according to an embodiment of the present invention. In an embodiment, the portion of the sacrificial layer 402 is removed in the vicinity of and below the strip 502, 503 of the bridge structure 602 so as to form a void or gap "G" between the bridge structure 602 and the third portion 104C, 204C of the first superconducting material 104, 204. In an embodiment, the gap "G" can be, for example, between about 2 µm and 4 µm. In an embodiment, the bridge structure 602 passes over the third portion 104C, 204C of the first superconducting material 104, 204. The bridge structure 602 electrically connects the first portion 104A, 204A to the second portion 104B, 204B while not electrically connecting the third portion 104C, 204C to the first portion 104A, 204A and no c electrically connecting the third portion 104C, 204C to the second portion 104B, 204B.

In an embodiment, removing the portion of the sacrificial layer 402 deposited on the substructure 100, 200 includes etching a portion of the sacrificial layer 402 under the strip 502 so as to form a gap "G" between the strip 502 and the third portion 104C, 204C of the first superconducting material 104, 204 to define the bridge structure 602 over the third portion 104C, 204C of the first superconducting material 104, 204. In an embodiment, etching the portion of the sacrificial layer 402 under the strip 502 includes etching the sacrificial layer 402 under the strip 502, 503 that is deposited on the third portion 104C, 204C and etching the sacrificial layer deposited within the first trench 106A, 206A and the second trench 106B, 206B separating the first portion 104A, 204A, the second portion 104B, 204B and the third portion 104C, 204C and not etching the sacrificial layer 402 at both ends of the strip 502, 503 including below base pads 502A, 503A and 502B, 503B. In an embodiment, etching the portion of the sacrificial layer 402 under the strip 502, 503 includes etching the portion of the sacrificial layer 402 using an acid etch.

Figure 6:
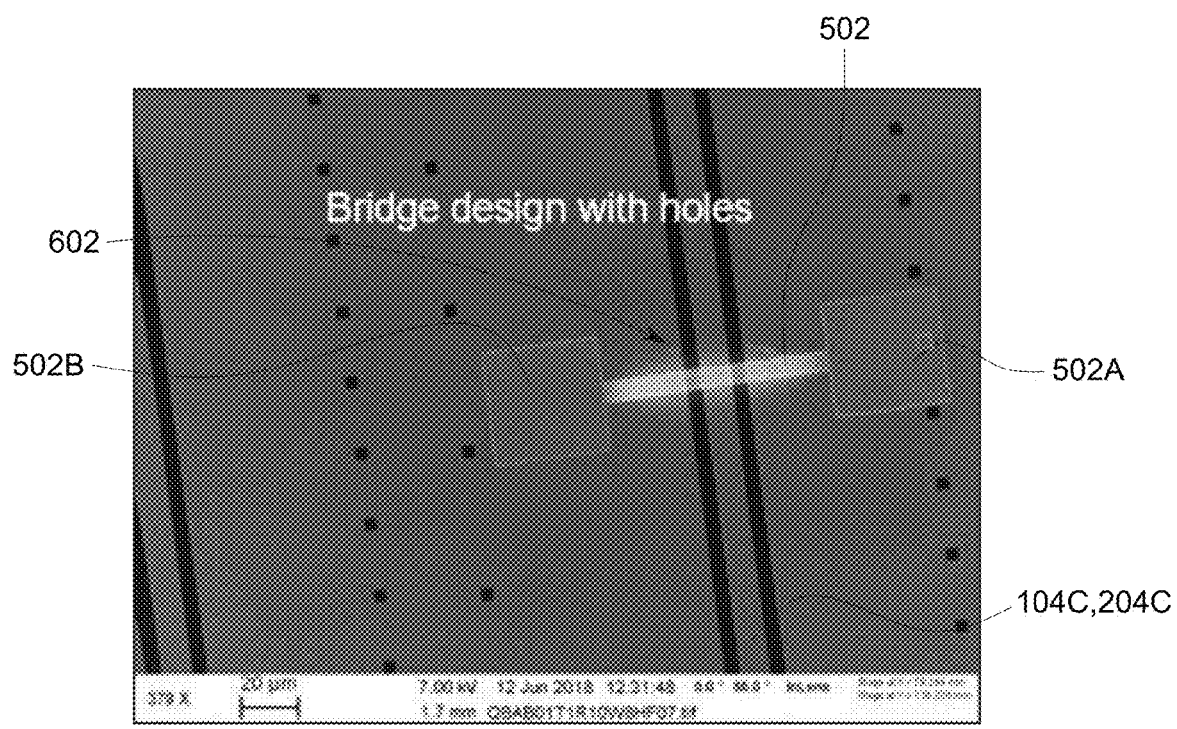
FIG. 6 is a scanning electron microscope (SEM) image showing the bridge structure including the strip and base pads at both ends of the strip, according to an embodiment of the present invention.

FIG. 6 is a scanning electron microscope (SEM) image showing the bridge structure 602 including the strip 502 and the base pads 502A and 502B, according to an embodiment of the present invention. The strip 502 of the bridge structure 602 is made from superconducting material 404 that is porous. The porosity of the strip 502 enables chemical etching of the sacrificial layer 402 below the strip 502 by allowing a fluid chemical etchant to reach the sacrificial layer 402 so as to form the bridge structure 602.

Figure 7:
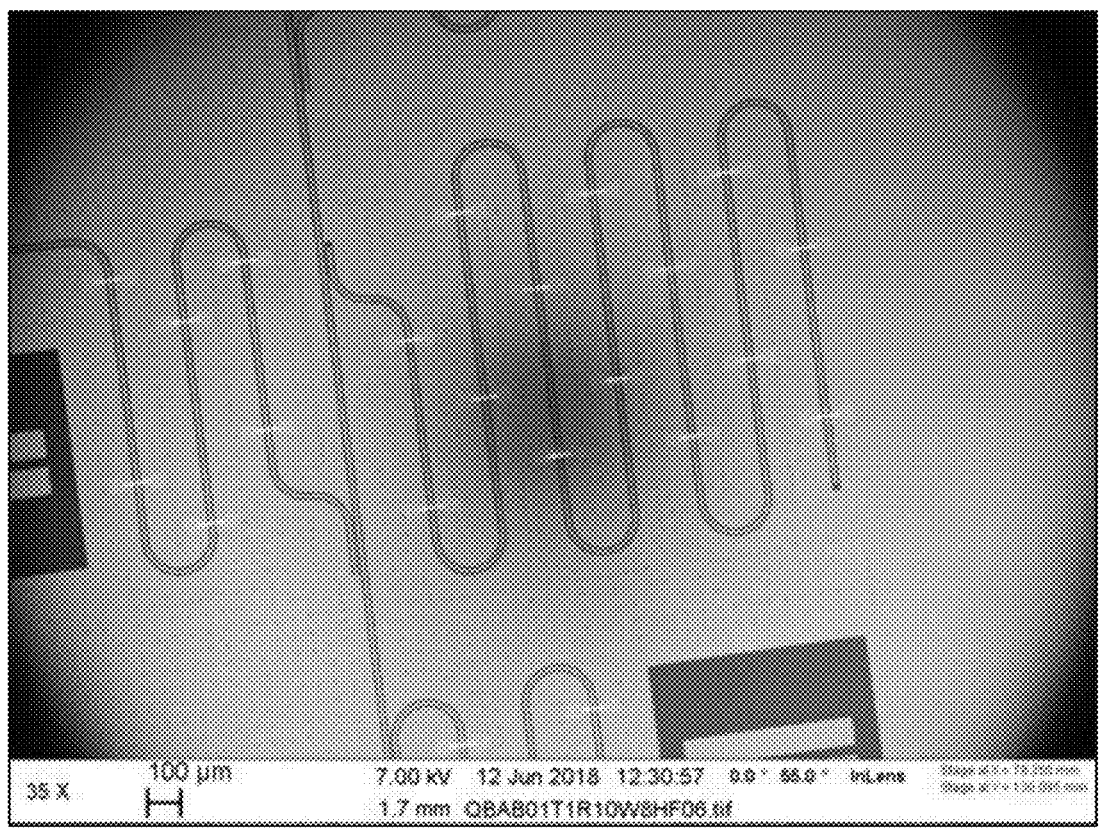
FIG. 7 is a scanning electron microscope (SEM) image showing a plurality of bridge structures disposed along a length of an electromagnetic transmission line, according to an embodiment of the present invention.

FIG. 7 is a scanning electron microscope (SEM) image showing a plurality of bridge structures 602 disposed along a length of an electromagnetic transmission line, according to an embodiment of the present invention. Each bridge structure 602 electrically connects the first portion 104A, 204A to the second portion 104B, 204B of the first superconducting material 104, 204 (which are connected to ground potential, for example) while passing over the third portion 104C, 204C of the first superconducting material 104, 204. The third portion 104C, 204C forms a part of a transmission line for carrying an electromagnetic signal to or from a qubit, for example. In an embodiment, the plurality of bridges structures 602 can be regularly spaced to reduce or substantially eliminate spurious modes that may arise otherwise.

Figure 8A:
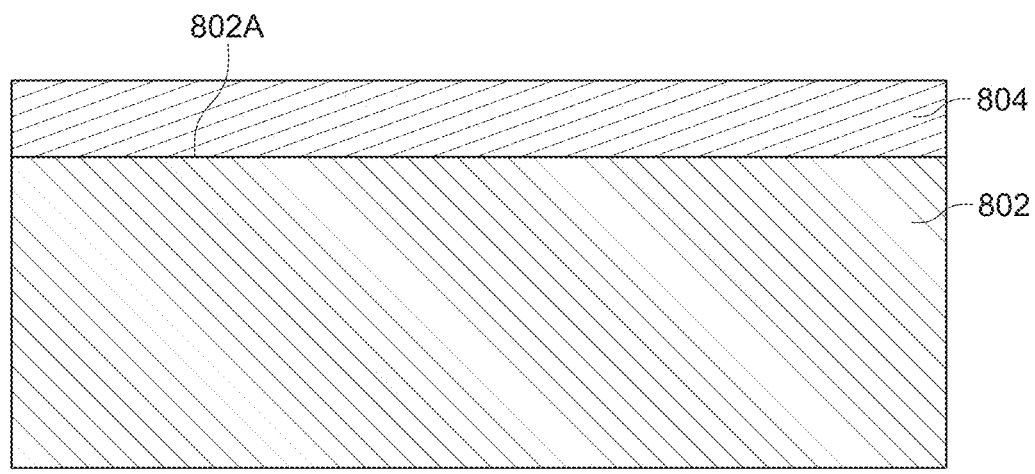
FIG. 8A is a schematic lateral view of a substrate on which is deposited a sacrificial layer, according to another embodiment of the present invention.
Figure 8B:
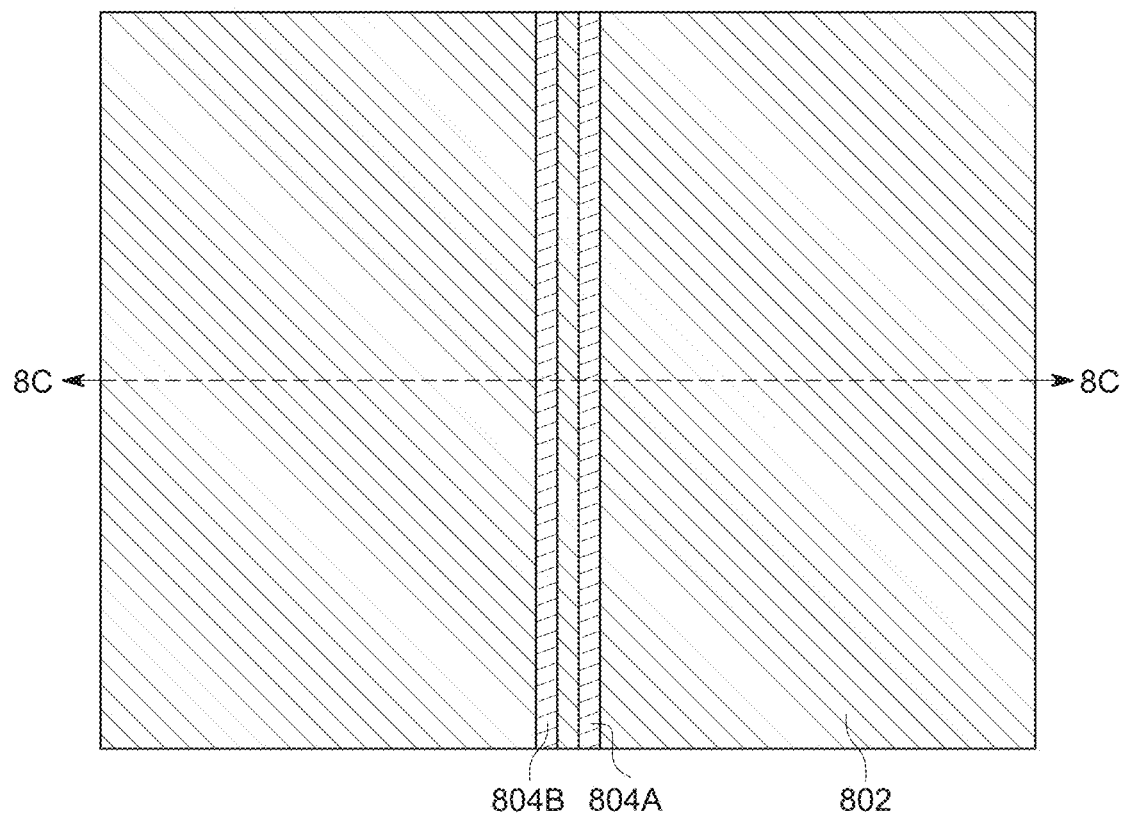
FIG. 8B is a schematic top view of the substrate with an etched sacrificial layer deposited thereon, according to another embodiment of the present invention.
Figure 8C:
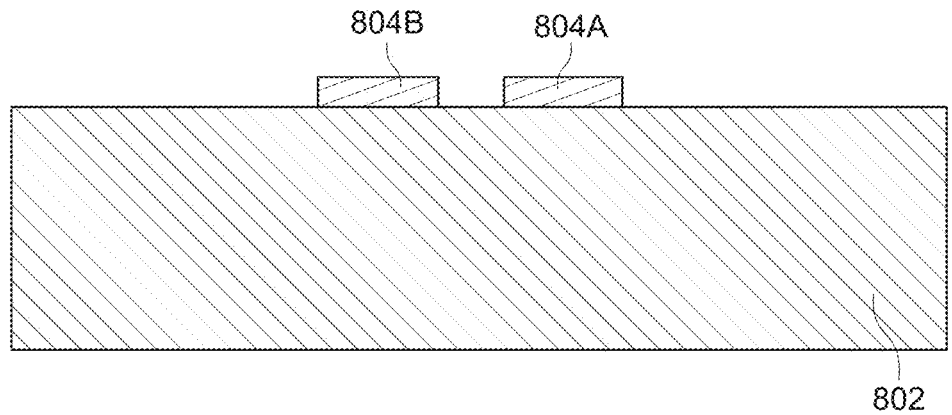
FIG. 8C is a schematic cross-section view of the substrate with the etched sacrificial layer deposited thereon taken at line 8C-8C shown in FIG. 8B, according to another embodiment of the present invention.

FIG. 8A is a schematic lateral view of a substrate 802 on which is deposited a sacrificial layer 804, according to another embodiment of the present invention. FIG. 8B is a schematic top view of the substrate 802 with an etched sacrificial layer 804 deposited thereon, according to another embodiment of the present invention. FIG. 8C is a schematic cross-section view of the substrate 802 with the etched sacrificial layer 804 deposited thereon taken at line 8C-8C shown in FIG. 8B, according to another embodiment of the present invention.

Figure 9A:
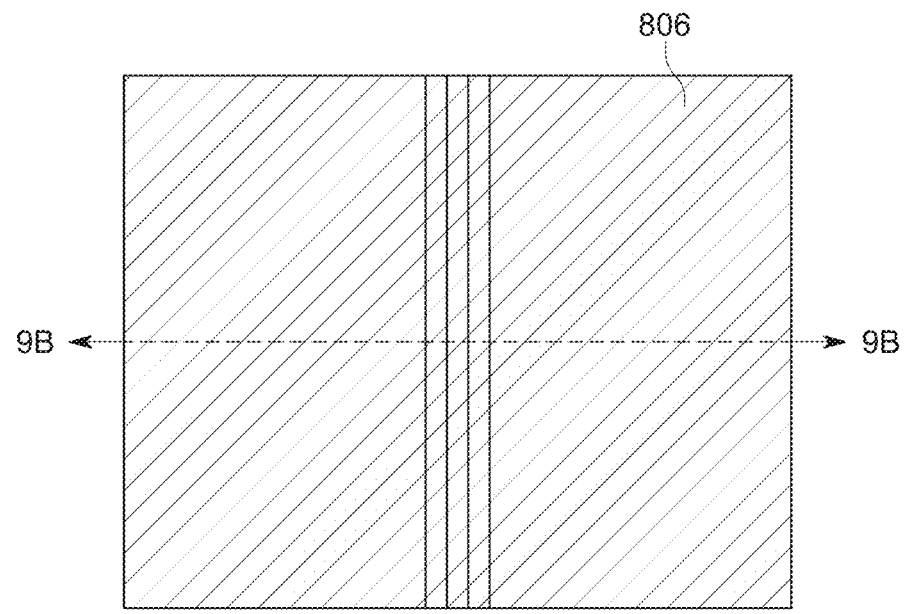
FIG. 9A is a schematic top view of the substrate on which is further deposited a layer of a first superconducting material, according to another embodiment of the present invention.

Similar to the above described method of fabricating the bridge structure, the following method also includes providing the substrate 802 having deposited thereon the layer of sacrificial material layer 804, as shown in FIG. 8A. In an embodiment, the substrate 802 can be silicon or sapphire, for example. In an embodiment, the sacrificial material layer 804 can be an oxide, for example. However, other materials can also be used. The substrate 802 has a surface 802A. The method includes depositing the layer of sacrificial material 804 on the surface 802A of the substrate 802, as shown in FIG. 9A. In an embodiment, depositing the sacrificial material layer 804 on top of the substrate 802 includes sputtering superconducting sacrificial material 804 on the surface 802A of the substrate 802. The method includes selectively etching the layer of sacrificial material 804 to form first and second spaced apart portions 804A and 804B of the sacrificial material 804, as shown in the top view of FIG. 8B and cross-section view of FIG. 8C.

Figure 8D:
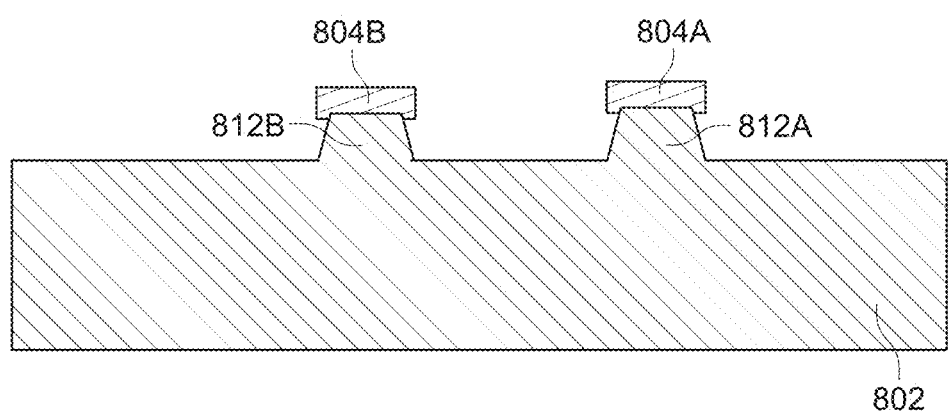
FIG. 8D is a schematic cross-section view of the substrate with the etched sacrificial material layer and selectively etched substrate, according to another embodiment of the present invention.

The method further includes selectively etching the substrate 802 except at the first portion 804A and the second portion 804B of the sacrificial material 804. FIG. 8D is a schematic cross-section view of the substrate 802 with the etched sacrificial material layer 804 and selectively etched substrate 802, according to another embodiment of the present invention. As shown in FIG. 8D, after etching the substrate 802, the first and second portions 804A and 804B are located on two respective protrusions 812A and 812B of the substrate 802.

Figure 9B:
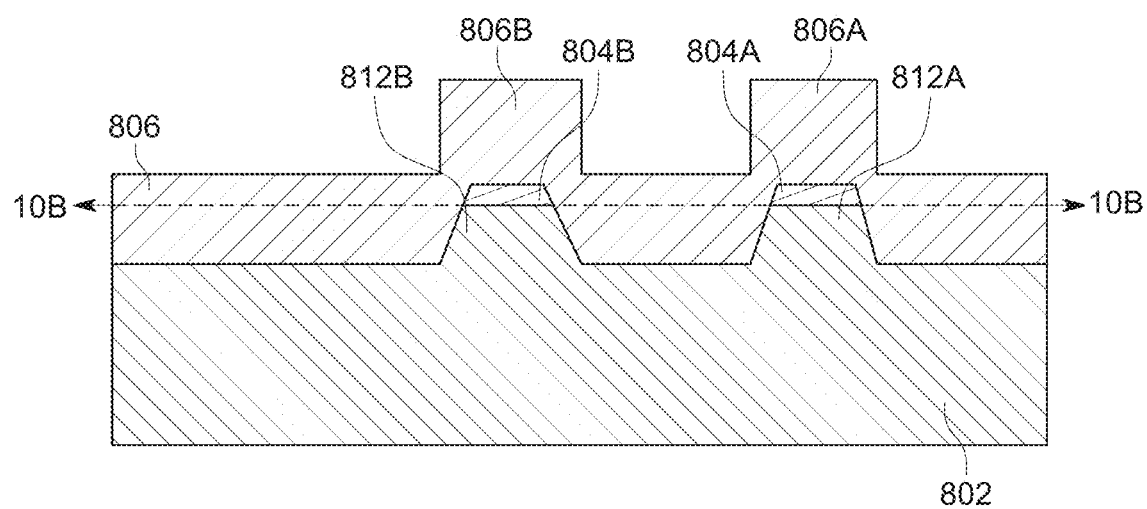
FIG. 9B is a schematic cross-section view of the substrate on which is further deposited the layer of the first superconducting material taken at line 9B-9B shown in FIG. 9A, according to an embodiment of the present invention.

The method further includes depositing a layer of a first superconducting material 806 on the etched substrate 802 and on the first and second portions 804A and 804B of the sacrificial material 804, as shown in FIG. 9A and FIG. 9B. In an embodiment, the first superconducting material can be, for example, niobium (Nb). However, other superconducting materials can also be used. FIG. 9A is a schematic top view of the substrate 802 on which is further deposited the layer of the first superconducting material 806, according to another embodiment of the present invention. FIG. 9B is a schematic cross-section view of the substrate 802 on which is further deposited the layer of the first superconducting material 806 taken at line 9B-9B, shown in FIG. 9A. As shown in FIG. 9B, in an embodiment, two protrusions 806A and 806B in the layer of the first superconducting material 806 are formed on top of the respective protrusions 812A and 812B of the substrate 802 on top of which are deposited the first and second portions 804A and 804B of the sacrificial material 804.

Figure 10A:
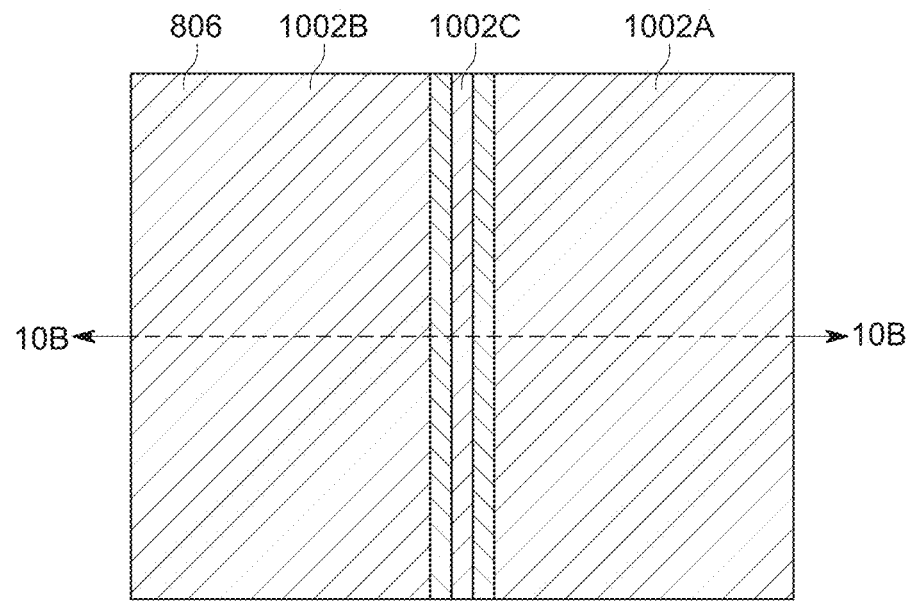
FIG. 10A is a schematic top view of the substrate having deposited thereon the layer of the first superconducting material divided into a first portion, a second portion and a third portion, according to an embodiment of the present invention.
Figure 10B:
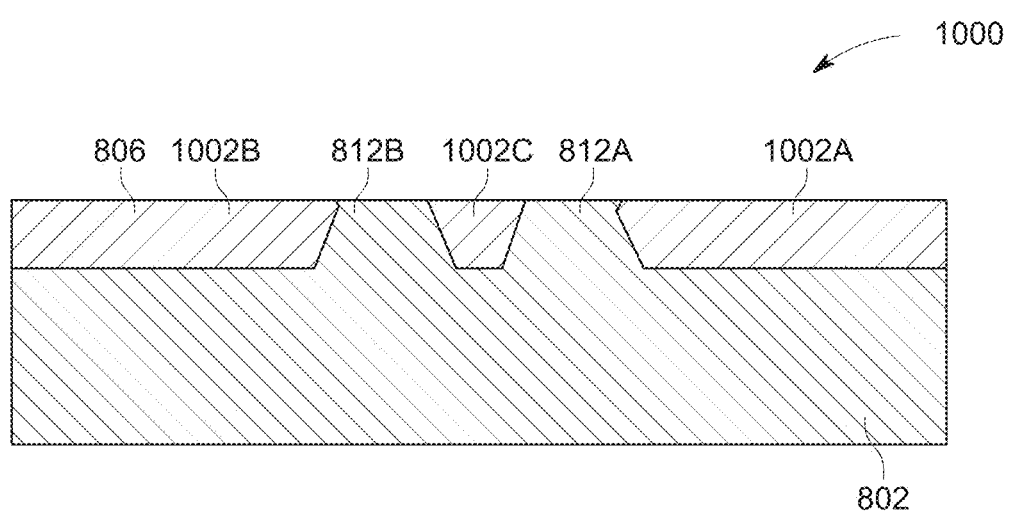
FIG. 10B is a schematic cross-section view of the substrate having deposited thereon the layer of the first superconducting material divided into the first portion, the second portion and the third portion that are electrically insulated from each other by protrusions of the substrate, the cross-section being taken at line 10A-10B shown in FIG. 10A, according to an embodiment of the present invention.

The method also includes removing the deposited layer of the first superconducting material 806 and the first portion 804A and second portion 804B of sacrificial material 804 to obtain a layer of the first superconducting material 806 divided into a first portion 1002A, a second portion 1002B and a third portion 1002C that are electrically insulated from each other by substrate material 802, as shown in FIGS. 10A and 10B. FIG. 10A is a schematic top view of the substrate 802 having deposited thereon the layer of the first superconducting material 806 divided into the first portion 1002A, the second portion 1002B and the third portion 1002C, according to an embodiment of the present invention. As shown in FIG. 10A, the deposited layer of the first superconducting material 806 and the first portion 804A and second portion 804B of sacrificial material 804 are removed up to line 10B-10B shown in FIG. 9B, to obtain the layer of the first superconducting material 806 divided into the first portion 1002A, the second portion 1002B and the third portion 1002C. In an embodiment, the deposited layer of the first superconducting material 806 is removed by using, for example, chemical or mechanical polishing also called damascene process wherein the superconducting material 806 is planarized. This is then followed by removing the first portion 804A and second portion 804B of sacrificial material 804 using for example a wet or dry etch process.

The first portion 1002A, the second portion 1002B and the third portion 1002C are electrically insulated from each other by protrusions 812A and 812B of the substrate 802, as shown in FIG. 10B. FIG. 10B is a schematic cross-section view of the substrate 802 having deposited thereon the layer of the first superconducting material 806 divided into the first portion 1002A, the second portion 1002B and the third portion 1002C that are electrically insulated from each other by protrusions 812A and 812B of the substrate 802, the cross-section being taken at line 10A-10B shown in FIG. 10A, according to an embodiment of the present invention. The obtained substructure 1000, shown in FIG. 10B, includes the substrate 802 having deposited thereon the layer of the first superconducting material 806 divided into the first portion 1002A, the second portion 1002B and the third portion 1002C.

Figure 11:
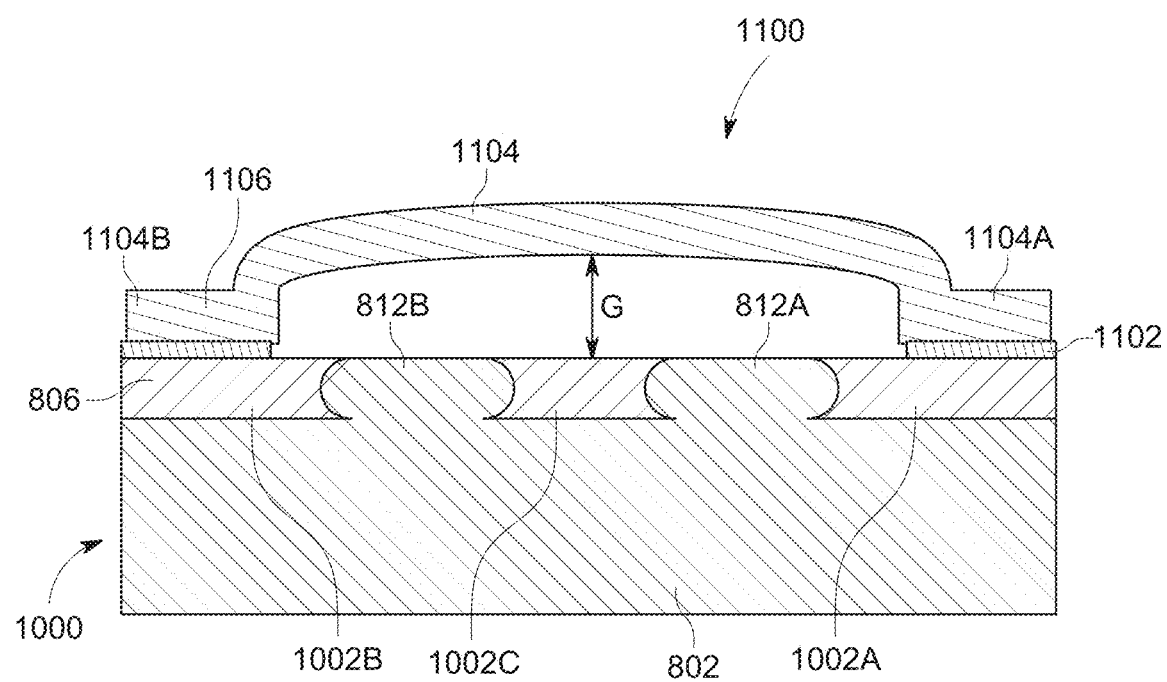
FIG. 11 is a schematic cross-section view of a bridge structure formed on the substructure, according to another embodiment of the present invention.

Following the above steps, similar steps to those described above with reference to FIGS. 1A-5 are performed to obtain a bridge structure. FIG. 11 is a schematic cross-section view of a bridge structure 1100 formed on the substructure 1000, according to another embodiment of the present invention. To obtain the bridge structure 1100, the method further includes depositing a superconducting sacrificial layer 1102 on the substructure 1000. In an embodiment, the sacrificial superconducting layer can be, for example, made from titanium (Ti), titanium nitride (TiN), or tantalum (Ta), or any combination thereof. In an embodiment, depositing the sacrificial layer 1102 includes sputtering superconducting sacrificial material on the substructure 1000. In an embodiment, the superconducting sacrificial layer 1102 is deposited on the first superconducting material layer 806 and on the protrusions 812A and 812B of the substrate 802.

In an embodiment, the method includes electrically connecting the first portion 1002A and the second portion 1002B of the first superconducting material 806 with a strip 1104 of a second superconducting material 1106, the second superconducting material 1106 being different from the first superconducting material 806.

In an embodiment, the second superconducting material 1106 is deposited on the superconducting sacrificial layer 1102. In an embodiment, depositing the second superconducting material 1106 on the substructure 1000 includes sputtering compressively stressed superconducting material to form the strip 1104 of the second superconducting material 1106, as shown in FIG. 11. In an embodiment, the strip 1104 traverses the third portion 1002C, as shown in FIG. 11. In an embodiment, electrically connecting the first portion 1002A, and the second portion 1002B of the first superconducting material 806 with the strip 1104 of the second superconducting material 1106 includes attaching a first base pad 1104A of the strip 1104 to the first portion 1002A and attaching a second base pad 1104B of the strip 1104 to the second portion 1002B.

In an embodiment, the method includes removing a portion of the superconducting sacrificial layer 1102 deposited on the substructure 1000 so as to form a bridge structure 1100 with the strip 1104 of the second superconducting material 1106 over the third portion 1002C between the first portion 1002A and the second portion 1002B. In an embodiment, the portion of the superconducting sacrificial layer 1102 is removed in the vicinity of and below the strip 1104 of the bridge structure 1100 so as to form a void or gap "G" between the bridge structure 1104 and the third portion 1002C of the first superconducting material 806. In an embodiment, the gap "G" can be, for example, between about 2 µm and 4 µm. In an embodiment, the bridge structure 1100 passes over the third portion 1002C of the first superconducting material 806. The bridge structure 1100 electrically connects the first portion 1002A to the second portion 1102B while not electrically connecting the third portion 1002C to the first portion 1002A and not electrically connecting the third portion 1002C to the second portion 1002B.

In an embodiment, removing the portion of the superconducting sacrificial layer 1102 deposited on the substructure 1000 includes etching a portion of the superconducting sacrificial layer 1102 under the strip 1104 so as to form the gap "G" between the strip 1104 and the third portion 1002C of the first superconducting material 806 to define the bridge structure 1100 over the third portion 1002C of the first superconducting material 806, as shown in FIG. 11. In an embodiment, etching the portion of the superconducting sacrificial layer 1102 under the strip 1004 includes etching the sacrificial layer 1102 under the strip 1104 that is deposited on the third portion 1002C but not etching the sacrificial layer 1102 at both ends of the strip 1104 including below base pads 1104A and 1104B. In an embodiment, etching the portion of the superconducting sacrificial layer 1102 under the strip 1104 includes etching the portion of the sacrificial layer 1102 using an acid etch, for example.

As it can be appreciated from the above paragraphs, there is provided a quantum mechanical device. Components of the quantum mechanical device are shown schematically in FIGS. 5 and 11 and in SEM images in FIGS. 6 and 7. In an embodiment, the quantum mechanical device includes substrate 102, 202, 802. The quantum mechanical device also includes a layer of a first superconducting material 104, 204, 806 deposited on the substrate 102, 202, 802. The layer of first superconducting material 104, 204, 806 is divided into a first portion 104A, 204A, 1002A, a second portion 104B, 204B, 1002B and a third portion 104C, 204C, 1002C that are electrically insulated from each other. The quantum mechanical device also includes a bridge structure 602, 1100 connected to the first portion 104A, 204A, 1002A and the second portion 104B, 204B, 1002B over the third portion 104C, 204C, 1002C that is located between the first portion 104A, 204A, 1002A and the second portion 104B, 204B, 1002B. The bridge structure 602, 1100 includes a strip 502, 1104 of a second superconducting material 404, 1106 configured to electrically connect the first portion 104A, 204A, 1002A and the second portion 104B, 204B, 1002B of the first superconducting material 104, 204, 806. The second superconducting material 404, 1106 of the strip 502, 1104 is different from the first superconducting material 104, 204, 806.

In an embodiment, the second superconducting material 404, 1106 of the strip 502, 1104 is porous at least in a portion that traverses the third portion 104C, 204C, 1002C of the layer of the first superconducting material 104, 204, 806. In an embodiment, the bridge structure 602, 1100 is configured to substantially eliminate spurious modes of planar microwave circuits.

In an embodiment, as shown for example in FIG. 7, the quantum mechanical device includes a plurality of bridge structures 602, 1100 spaced apart regularly to electrically connect the first portion 104A, 204A, 1002A and the second portion 104B, 204B, 1002B of the layer of the first superconducting material 104, 204, 806 at a plurality of position of the layer of the first superconducting material 104, 204, 806. In an embodiment, the plurality of bridge structures 602, 1100 is configured to connect the first portion 104A, 204A, 1002A and the second portion 104B, 204B, 1002B of the layer of the first superconducting material 104, 204, 806 to a same ground potential.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method for fabricating a bridge structure in a quantum mechanical device, comprising:

providing a substructure comprising a substrate having deposited thereon a layer of a first superconducting material divided into a first portion, a second portion and a third portion that are electrically insulated from each other;

depositing a sacrificial layer on the substructure;

electrically connecting the first portion and the second portion of the first superconducting material with a strip of a second superconducting material, the second superconducting material being different from the first superconducting material; and removing a portion of the sacrificial layer deposited on the substructure so as to form a bridge structure with the strip of the second superconducting material over the third portion between the first portion and the second portion, the bridge structure electrically connecting the first portion to the second portion while not electrically connecting the third portion to the first portion and not electrically connecting the third portion to the second portion, wherein removing the portion of the sacrificial layer deposited on the substrate comprises etching a portion of the sacrificial layer under the strip so as to form a gap between the strip and the third portion of the first superconducting material to define the bridge structure over the third portion of the first superconducting material, and wherein etching the portion of the sacrificial layer under the strip comprises etching the sacrificial layer under the strip that is deposited on the third portion and etching the sacrificial layer deposited within a first trench and a second trench separating the first, second and third portion and not etching the sacrificial layer at both ends of the strip.

2. The method according to claim 1, wherein providing the substructure comprises providing the substrate having a surface and depositing the layer of the first superconducting material on said surface of the substrate.

3. The method according to claim 2, wherein providing the substructure further comprises etching said layer of the first superconducting material to form a first trench and a second trench so as to define the first portion, the second portion and the third portion of said layer of the first superconducting material such that the first portion, the second portion and the third portion of the layer of the first superconducting material are spaced apart from each other by the etched first trench and the etched second trench.

4. The method according to claim 1, wherein the substrate comprises Silicon or Sapphire.

5. The method according to claim 1, wherein the first superconducting material comprises Niobium or Aluminum.

6. The method according to claim 1, wherein the sacrificial layer comprises titanium (Ti), titanium nitride (TiN), or tantalum (Ta), or any combination thereof.

7. The method according to claim 1, wherein depositing the sacrificial layer on the substructure comprises sputtering superconducting sacrificial material on the substructure.

8. The method according to claim 1, wherein electrically connecting the first portion and the second portion of the first superconducting material with the strip of the second superconducting material comprises sputtering compressively stressed superconducting material to form the strip of the second superconducting material.

9. The method according to claim 1, wherein electrically connecting the first portion and the second portion of the first superconducting material with the strip of the second superconducting material comprises attaching a first base pad of the strip to the first portion and attaching a second base pad of the strip to the second portion.

10. The method according to claim 1, wherein electrically connecting the first portion and the second portion of the first superconducting material with the strip of the second superconducting material comprises electrically connecting the first portion and the second portion of the first superconducting material with a strip of porous second superconducting material.

11. The method according to claim 1, wherein etching the portion of the sacrificial layer under the strip comprises etching the portion of the sacrificial layer using an acid etch.

12. A method for fabricating a bridge structure in a quantum mechanical device, comprising:
providing a substructure comprising a substrate having deposited thereon a layer of a first superconducting material divided into a first portion, a second portion and a third portion that are electrically insulated from each other;
depositing a sacrificial layer on the substructure;
electrically connecting the first portion and the second portion of the first superconducting material with a strip of a second superconducting material, the second superconducting material being different from the first superconducting material; and
removing a portion of the sacrificial layer deposited on the substructure so as to form a bridge structure with the strip of the second superconducting material over the third portion between the first portion and the second portion, the bridge structure electrically connecting the first portion to the second portion while not electrically connecting the third portion to the first portion and not electrically connecting the third portion to the second portion,
wherein providing the substructure comprises:
providing the substrate having a surface;
depositing a layer of sacrificial material on the surface of the substrate;
selectively etching said layer of sacrificial material to form first and second spaced apart portions of the sacrificial material;
selectively etching the substrate except at said first and second portions of the sacrificial material;
depositing a layer of the first superconducting material on the etched substrate and the first and second portions of the sacrificial material; and
removing the deposited layer of the first superconducting material and the first and second portions of sacrificial material to obtain a layer of the first superconducting material divided into the first portion, the second portion and the third portion that are electrically insulated from each other by substrate material.

13. The method according to claim 12, wherein depositing the sacrificial layer on top of the substructure comprises sputtering superconducting sacrificial material on the layer of the first superconducting material.

14. The method according to claim 13, wherein removing the portion of the sacrificial layer deposited on the substrate comprises etching a portion of the sacrificial layer under the strip and etching the substrate material separating the first, second and third portion of the superconducting material so as to form a gap between the strip and the third portion of the first superconducting material to define the bridge structure over the third portion of the first superconducting material.

15. A quantum mechanical device, comprising:
a substrate;
a layer of a first superconducting material deposited on the substrate, said layer being divided into a first portion, a second portion and a third portion that are electrically insulated from each other; and
a bridge structure connected to the first portion and the second portion over the third portion that is located between the first portion and the second portion, the bridge structure comprising a strip of a second superconducting material configured to electrically connect the first portion and the second portion of the first superconducting material,
wherein the second superconducting material of the strip is different from the first superconducting material, and
wherein the first portion and the second portion of the layer of the first superconducting material are first and second signal lines configured to carry a first electromagnetic signal to or from a first qubit and the third portion is a third signal line configured to carry a second electromagnetic signal to or from a second qubit.

16. The quantum mechanical device according to claim 15, further comprising a plurality of bridge structures spaced apart regularly to electrically connect the first portion and the second portion of the layer of the first superconducting material at a plurality of position of the layer of the first superconducting material.

17. The quantum mechanical device according to claim 16, wherein the plurality of bridge structures is configured to connect the first portion and the second portion of the layer of the first superconducting material to a same ground potential.

18. The quantum mechanical device according to claim 15, wherein the second superconducting material of the strip is porous at least in a portion that traverses the third portion of the layer of the first superconducting material.

19. The quantum mechanical device according to claim 15, wherein the first portion and the second portion of the first superconducting material are connected to a same ground potential.

20. The quantum mechanical device according to claim 15, wherein the third portion of the first superconducting material is a signal line configured to carry an electromagnetic signal to and from a qubit.

21. The quantum mechanical device according to claim 15, wherein the bridge structure is configured to substantially eliminate spurious modes of planar microwave circuits.

* * * * *